(12) United States Patent
Anderson et al.

(10) Patent No.: US 7,759,179 B2
(45) Date of Patent: Jul. 20, 2010

(54) MULTI-GATED, HIGH-MOBILITY, DENSITY IMPROVED DEVICES

(75) Inventors: Brent A. Anderson, Jericho, VT (US);
Andres Bryant, Burlington, VT (US);
Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 12/023,347

(22) Filed: Jan. 31, 2008

(65) Prior Publication Data

US 2009/0197382 A1    Aug. 6, 2009

(51) Int. Cl.
*H01L 21/00* (2006.01)
*H01L 21/84* (2006.01)

(52) U.S. Cl. .............. 438/154; 438/149; 438/164; 438/479; 438/517; 438/525; 257/347; 257/401; 257/627; 257/628; 257/E21.411; 257/E21.633

(58) Field of Classification Search ........... 438/283, 438/517, 149, 154, 164, 479, 525; 257/347, 257/401, 627, 628, E21.411, 633
See application file for complete search history.

(56) References Cited

U.S. PATENT DOCUMENTS

| | | | |
|---|---|---|---|
| 6,657,259 B2 | 12/2003 | Fried et al. | |
| 6,787,406 B1 * | 9/2004 | Hill et al. | 438/164 |
| 6,794,718 B2 * | 9/2004 | Nowak et al. | 257/347 |
| 6,867,460 B1 | 3/2005 | Anderson et al. | |
| 7,230,287 B2 | 6/2007 | Anderson et al. | |
| 2004/0119100 A1 * | 6/2004 | Nowak et al. | 257/204 |
| 2007/0018253 A1 * | 1/2007 | Liaw | 257/369 |
| 2007/0063276 A1 | 3/2007 | Beintner et al. | |
| 2007/0238273 A1 * | 10/2007 | Doyle et al. | 438/525 |
| 2008/0054361 A1 * | 3/2008 | Siprak | 257/365 |

\* cited by examiner

*Primary Examiner*—Thao X Le
*Assistant Examiner*—Eric W Jones
(74) *Attorney, Agent, or Firm*—Gibb I.P. Law Firm, LLC

(57) ABSTRACT

Disclosed herein are embodiments of an improved method of forming p-type and n-type MUGFETs with high mobility crystalline planes in high-density, chevron-patterned, CMOS devices. Specifically, semiconductor fins are formed in a chevron layout oriented along the centerline of a wafer. Gates are formed adjacent to the semiconductor fins such that they are approximately perpendicular to the centerline. Then, masked implant sequences are performed, during which halo and/or source/drain dopants are implanted into the sidewalls of the semiconductor fins on one side of the chevron layout and then into the sidewalls of the semiconductor fins on the opposite side of the chevron layout. The implant direction used during these implant sequences is substantially orthogonal to the gates in order to avoid mask shadowing, which can obstruct dopant implantation when separation between the semiconductor fins in the chevron layout is scaled (i.e., when device density is increased).

20 Claims, 5 Drawing Sheets

MULTI-GATED, HIGH-MOBILITY, DENSITY IMPROVED DEVICES

BACKGROUND

1. Field of the Invention

The embodiments of the invention generally relate to complementary metal oxide semiconductor (CMOS) devices and, more particularly, to an improved method for forming p-type and n-type, multi-gated, non-planar, field effect transistors (MUGFETs) with high mobility crystalline semiconductor fins in high-density, chevron-patterned, CMOS devices.

2. Description of the Related Art

Integrated circuit design decisions are often driven by device scalability and manufacturing efficiency. For example, as the size of planar field effect transistors (planar FETs) is reduced, generally so is the drive current. In response, MUGFETs, such as fin-type FETs (FINFETs) or trigate FETs, were developed to provide scaled devices with faster drive currents and reduced short channel effects.

Integrated circuit design decisions are also driven by a desire for improved performance, such as a desire to reduce device delay. For example, in both NFETS and PFETs, charge carrier mobilities effect delay. These charge carrier mobilities can be a function of the crystalline orientation of the semiconductor material used to form the FET channel region. Recent developments in MUGFET technology allow semiconductor fins having different crystalline orientations to be formed on the same substrate. For example, semiconductor fins can be formed in a chevron pattern from a [100] crystalline orientation semiconductor layer such that the semiconductor fins on opposite sides of the chevron have different crystalline orientations (e.g., [100] crystalline orientation and [110] crystalline orientation, respectively). The [100] crystalline orientation semiconductor fins can be incorporated into NFETs for optimal electron mobility, whereas the [110] crystalline orientation semiconductor fins can be incorporated into PFETs for optimal hole mobility. However, due to the different fin angles (i.e., due to the chevron pattern), CMOS devices with such high mobility semiconductor fins are subject to unique density and scalability issues as compared to conventional CMOS devices.

SUMMARY

Disclosed herein are embodiments of an improved method of forming p-type and n-type MUGFETs with high-mobility crystalline planes in high-density, chevron-patterned, CMOS devices. Specifically, semiconductor fins are formed in a chevron layout oriented along a centerline of a wafer. Gates are formed adjacent to the semiconductor fins such that they are approximately perpendicular to the centerline. Then, masked implant sequences are performed, during which halo and/or source/drain dopants are implanted into the opposing sidewalls of the semiconductor fins on one side of the chevron layout and then into the opposing sidewalls of the semiconductor fins on the opposite side of the chevron layout. The implant direction used during these implant sequences is substantially orthogonal to the gates in order to avoid mask shadowing, which can obstruct dopant implantation when separation between the semiconductor fins in the chevron layout is scaled (i.e., when device density is increased).

More particularly, disclosed herein are embodiments of a method of forming a CMOS device. The method embodiments comprise forming, on a wafer, a first semiconductor body and a second semiconductor body such that the first semiconductor body is non-parallel and non-orthogonal relative to the second semiconductor body. Specifically, the wafer can comprise a crystalline semiconductor layer (e.g., a crystalline layer of silicon (Si), germanium (Ge), silicon germanium (SiGe), silicon germanium carbide (SiGeC), gallium arsenide (GaAs), indium arsenide (InAs), etc.) The first and second semiconductor bodies can be formed from this crystalline semiconductor layer such that they are at predetermined angles relative to the centerline. Thus, the first semiconductor body will have a first crystalline orientation and the second semiconductor body will have a second crystalline orientation that is different from the first crystalline orientation. For example, the first and second semiconductor bodies can each be formed at approximately 22.5° angles relative to the centerline of the wafer such that the first semiconductor body is positioned at an approximately 45° angle relative to the second semiconductor body. In this case, if the crystalline semiconductor layer has a [100] crystalline orientation, then the first semiconductor body will have a [100] crystalline orientation and the second semiconductor body will have a [110] crystalline orientation. Next, gates can be formed adjacent to the first and second semiconductor bodies such that the gates are approximately perpendicular to a centerline of the wafer.

After the gates are formed, a first mask can be formed covering the first semiconductor body and a first implant sequence can be performed so as to implant dopants into the opposing sidewalls of the second semiconductor body. This first implant sequence can comprise directing dopants (e.g., halo and/or source/drain extension dopants for a first type FET, such as a PFET) into the second semiconductor body at a first angle relative to the gates and, then, directing the dopants into the second semiconductor body at a second angle relative to the gates. The first and second angles can be pre-selected to ensure that implantation of the dopants into the opposing sidewalls of the second semiconductor body is not obstructed by the first mask. For example, the first angle can be an approximately 90° angle relative to the gates and the second angle can be an approximately 270° angle relative to the gates. Implanting the dopants into the sidewalls of the second semiconductor body from a direction that is substantially orthogonal to the gates prevents shadowing by the first mask over the second semiconductor body.

The process is repeated for the first semiconductor body. Specifically, the first mask is removed from the first semiconductor body and a second mask is formed covering the second semiconductor body. Next, a second implant sequence is performed so as to implant additional dopants (e.g., halos and/or source/drain extension dopants for a second type FET, such as an NFET) into the opposing sidewalls of the first semiconductor body. As with the first implant sequence, the second implant sequence comprises directing the additional dopants into the first semiconductor body at a first angle relative to the gates and, then, directing the additional dopants into the first semiconductor body at a second angle relative to the gates. The implant angles can be the same for the second implant sequence as they are for the first implant sequence. That is, the first angle and the second angle of the second implant sequence can be pre-selected to ensure that implantation of the additional dopants into the opposing sidewalls of the first semiconductor body is not obstructed by the second mask. For example, the first angle can be an approximately 90° angle relative to the gates and the second angle can be an approximately 270° angle relative to the gates. Implanting the additional dopants into the sidewalls of the first semiconductor body from a direction that is substantially orthogonal to the gates prevents shadowing by the second mask over the first semiconductor body.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of these embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
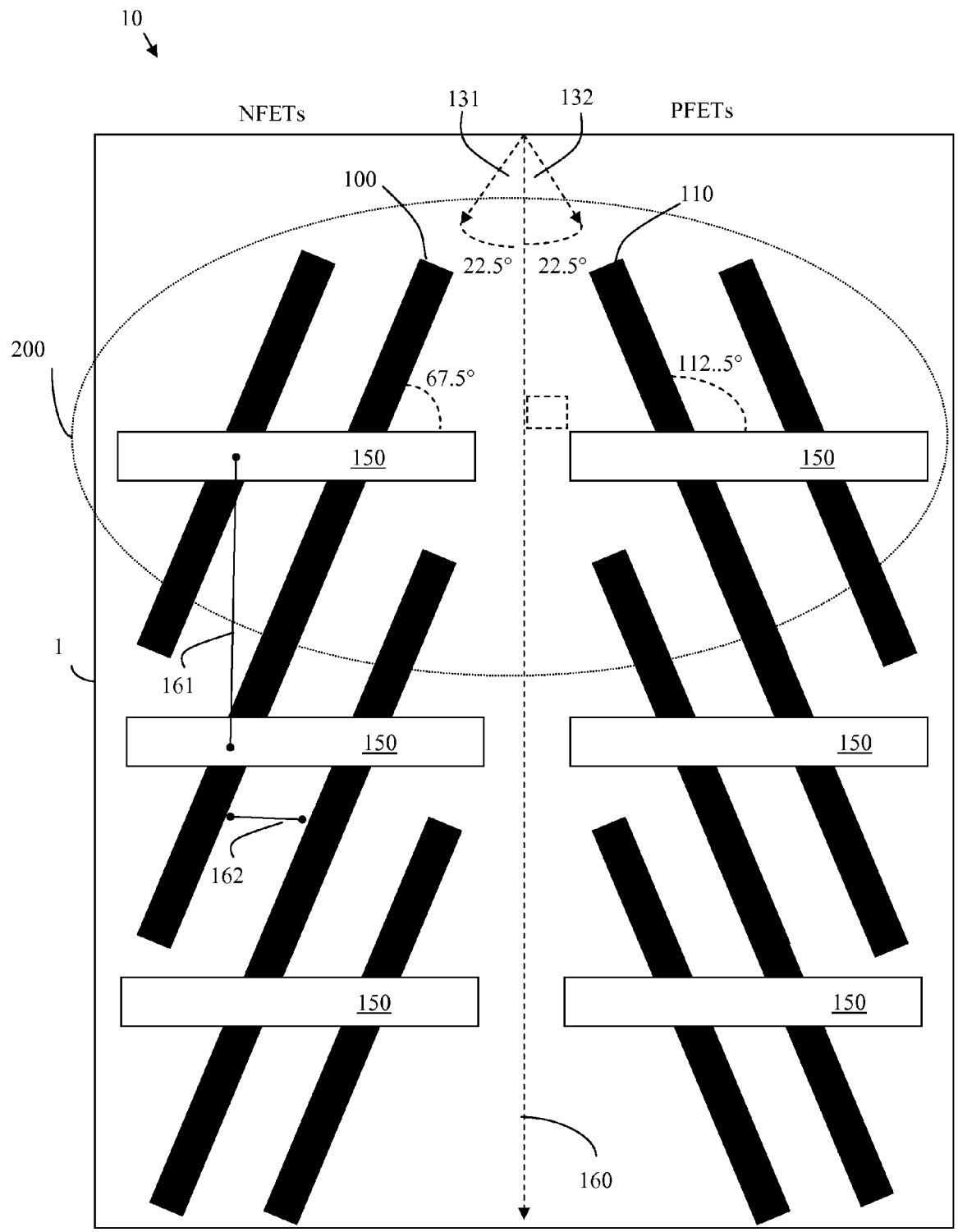
FIG. 1 is a top view diagram illustrating an exemplary partially completed integrated circuit structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, integrated circuit design decisions are often driven by device scalability and manufacturing efficiency. For example, as the size of planar field effect transistors (planar FETs) is reduced, generally so is the drive current. In response, multi-gated, non-planar, field effect transistors (MUGFETs), such as fin-type FETs (FINFETs) or trigate FETs, were developed to provide scaled devices with faster drive currents and reduced short channel effects. Specifically, finFETs are non-planar MUGFETs in which a fully depleted channel region is formed in the center of a thin semiconductor fin with source and drain regions in the opposing ends of the fin adjacent to the channel region. Gates are formed on each side of the thin fin in an area corresponding to the channel region. The effective fin width is determined by the fin height (e.g., short wide fins can cause partial depletion of a channel). Typically, for a double-gated fin-FET, a fin thickness of approximately one-fourth the length of the gate (or less) can ensure suppression of deleterious short-channel effects, such as variability in threshold voltage and excessive drain leakage currents. Trigate FETs have a similar structure to that of finFETs; however, the fin width and height are approximately the same so that gates can be formed on three sides of the channel, including the top surface and the opposing sidewalls. The height to width ratio of trigate FETs is generally in the range of 3:2 to 2:3 so that the channel will generally remain fully depleted, while allowing the three-dimensional field effects to provide greater drive current and improved short-channel characteristics over planar FETs.

Integrated circuit design decisions are also driven by a desire for improved performance, such as a desire to reduce device delay. For example, in both NFETS and PFETs, charge-carrier mobilities affect delay. These mobilities can be functions of the crystalline orientation of the semiconductor material used to form the FET channel region. The following patent documents, which are each incorporated in their entirety by reference, disclose several recent developments in MUGFET technology that allow semiconductor fins with different crystalline orientations to be formed on the same substrate in order to optimize the performance of both NFETs and PFETs in CMOS devices: U.S. Pat. No. 6,794,718 issued to Nowak et al. on Sep. 21, 2004; U.S. Pat. No. 6,867,460 issued to Anderson et al. on Mar. 15, 2005 and U.S. patent application Ser. No. 11/939,574 filed on Nov. 15, 2007 to Anderson et al.

U.S. Pat. No. 6,794,718 discloses a chevron CMOS structure. In particular, semiconductor fins are cut from a [100] crystalline orientation semiconductor substrate such that they are positioned at a non-orthogonal, non-parallel, angle with respect to one another (i.e., in a chevron pattern). The chevron pattern results in semiconductor fins on opposite sides of the chevron having different crystalline orientations (i.e., [100] and [110] crystalline orientations). NFETs are formed using semiconductor fins with [100] crystalline orientation for optimal for electron mobility, whereas PFETs are formed using semiconductor fins with [110] crystalline orientation for optimal hole mobility. U.S. Pat. No. 6,867,460 explains in more detail that [100] and [110] orientation semiconductor fins can be cut from a [100] orientation-surfaced silicon wafer by patterning semiconductor fins on either side, respectively, of the wafer centerline and further at a 22.5° angle with the respect to the center line such that the different orientation fins are at an angle of 45° with respect to each other. Finally, U.S. patent application Ser. No. 11/939,574 filed on Nov. 15, 2007 to Anderson et al., discloses a method of forming stacked, chevron-patterned, CMOS devices in a manner that maximizes device density and avoids contacted-gate pitch and fin pitch mismatch.

Figure 2:
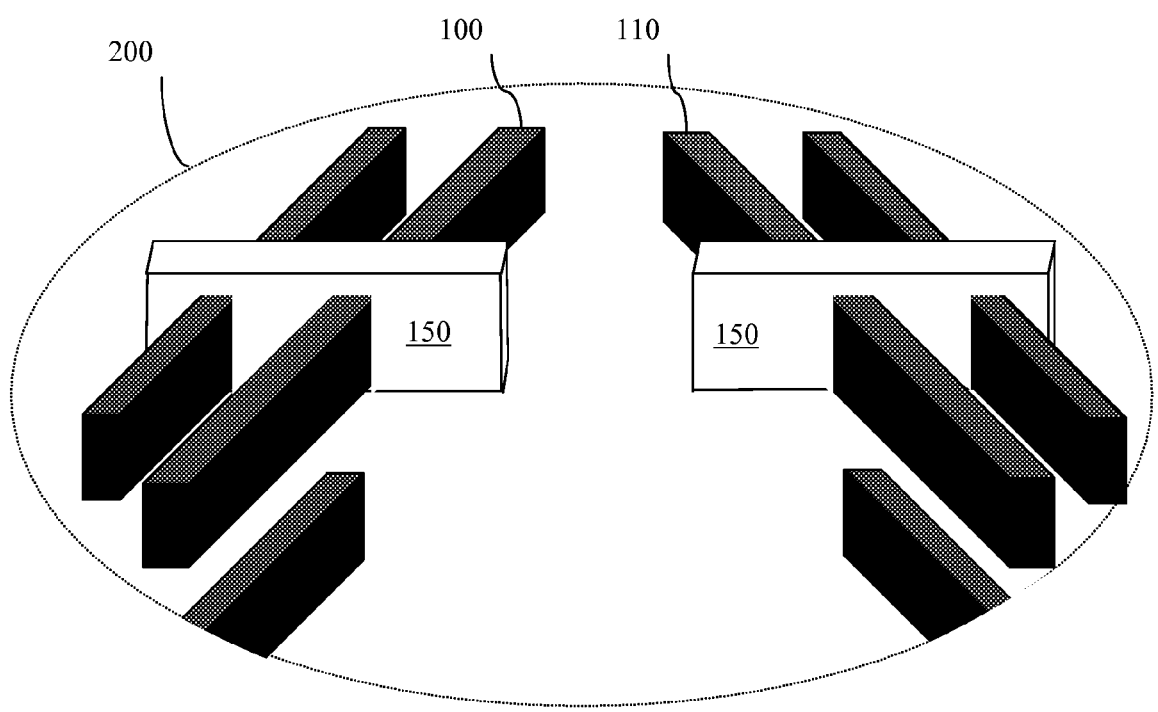
FIG. 2 is a perspective view diagram illustrating portion 200 of FIG. 1.

Unfortunately, due to the different angles of the high-mobility semiconductor fins for NFETs relative to the high-mobility semiconductor fins for PFETs, CMOS devices that incorporate these high-mobility semiconductor fins are subject to unique density and scalability issues as compared to conventional CMOS devices. For example, FIG. 1 is a top view diagram illustrating an exemplary partially completed integrated circuit structure 10 on a wafer 1. The circuit structure 10 is used to form stacked, high-density, chevron-patterned, CMOS devices and is formed according to current state of the art chevron patterning techniques, as disclosed in the above-referenced patent documents. FIG. 2 is a perspective view diagram illustrating portion 200 of FIG. 1. Referring to FIGS. 1 and 2 in combination, the structure 10 comprises first semiconductor fins 100 to the left of and at a 22.5° angle with respect to a wafer centerline 160 such that they have a [100] crystalline orientation optimal for electron mobility in NFET channel regions. It further comprises second semiconductor fins 110 to the right of and at a 22.5° angle with respect to the wafer centerline 160 such that they have a [110] crystalline orientation optimal for hole mobility in PFET channel regions. Thus, the first and second semiconductor fins 100 and 110 are at a 45° angle (i.e., a non-orthogonal, non-parallel, angle) with respect to each other.

The structure 10 further comprises gates 150 adjacent to designated channel regions within the center portion of the semiconductor fins 100, 110. The gates 150 are specifically patterned and etched such that they are positioned at right angles (i.e., orthogonally) with respect to the center line 160 of the wafer and, thus, at an approximately 67.5° angle with respect to the first semiconductor fins 100 and at an approximately 112.5° angle with respect to second semiconductor fins 110. Additionally, current scaling techniques allow the device density in the structure 10 to be maximized such that the contacted gate pitch 161 is, for example, less than approximately 150 nm and further such that the spacing 162 between fins is less than approximately 60 nm.

Figure 3:
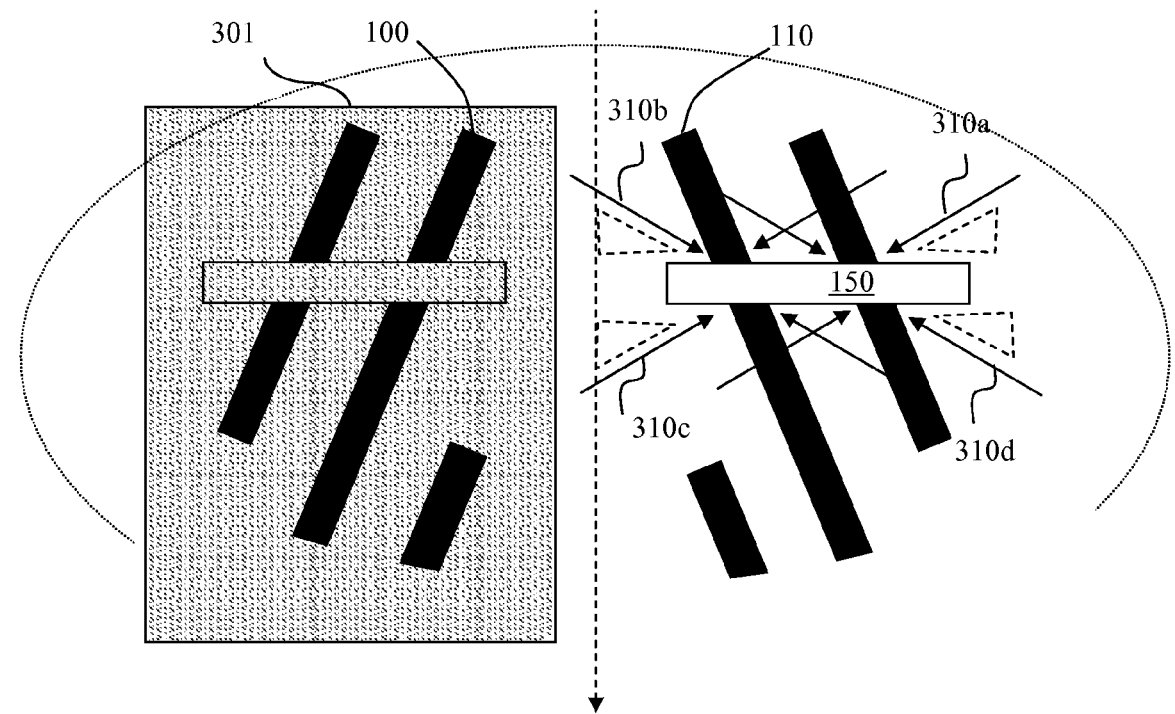
FIG. 3 is a top view diagram illustrating an exemplary implant sequence performed on the integrated circuit structure of FIG. 1.

In order to complete the stacked, high-density, chevron-patterned, CMOS devices using the structure 10, prior art techniques call for discrete masked implant sequences to be performed in order to appropriately dope exposed portions of the first semiconductor fins 100 with NFET halo and/or source/drain dopants and further to appropriately dope exposed portions of the second semiconductor fins 110 with PFET halo and/or source/drain dopants. For example, referring to FIGS. 3 and 4 in combination, a mask 301 is typically formed to protect one set of semiconductor fins (e.g., in this case, the first semiconductor fins 100). Then, one or more implant sequences are performed so as to form halos, source/drain extensions and/or source/drain regions within the exposed portions of the unmasked set of semiconductor fins (e.g., in this case, the second semiconductor fins 110). Specifically, during the halo implant sequence and/or the source/drain extension implant sequence, dopants are directed into the sidewalls of the semiconductor fins at various twist angles 310*a-d* (namely, approximately 30°, 150°, 210° and 330° relative to the gate 150) in an attempt to ensure that the opposing sidewalls of the fins on either side of the gate 150 are uniformly doped. Additionally, during the halo implant sequence and/or the source/drain extension implant sequence, a tilt angle 315 of approximately 15-30° relative to the top surface of the wafer 1 is used to ensure that dopant implantation into one semiconductor fin is not obstructed by an adjacent semiconductor fin.

Figure 4:
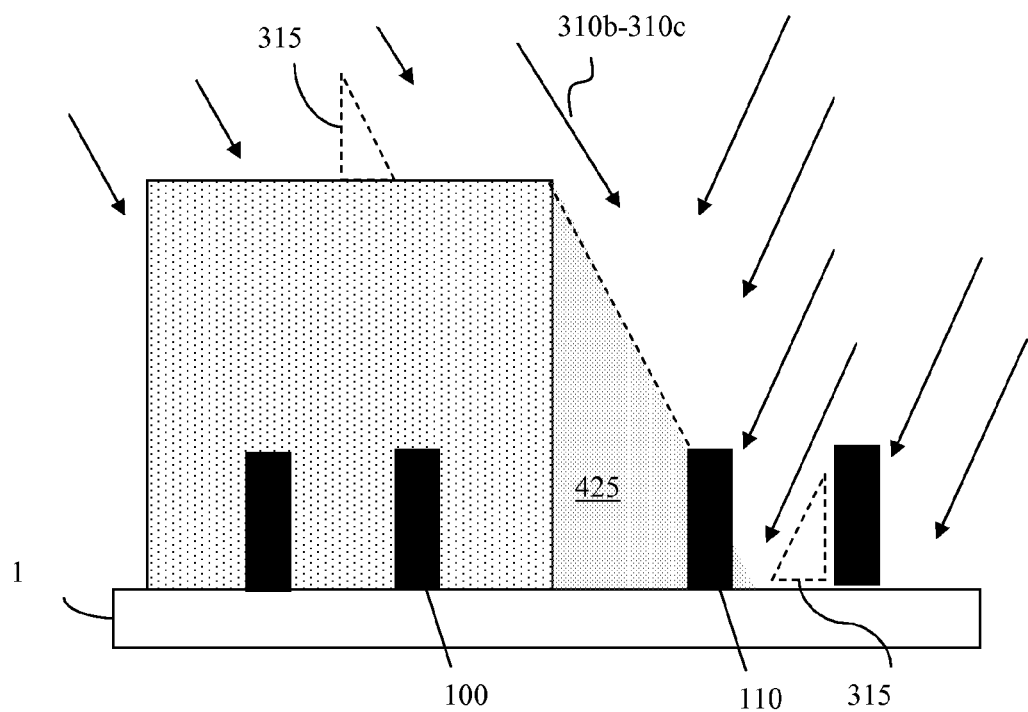
FIG. 4 is a cross-section view diagram illustrating the exemplary implant sequence of FIG. 3.

Unfortunately, with scaling to the 45 nm node and beyond, the physical separation between nFET and pFET fins is reduced and the distance between the masking resist 301 and those fins nearest this masking resist, becomes too small to avoid shadowing during the above-described implant sequences. Thus to avoid such shadowing, a density penalty is introduced by requiring sufficient separation of nFET and pFET fins to avoid such shadowing. Specifically, when MUGFET devices are scaled and density is maximized and, specifically, when the distance between semiconductor fins 100, 110 in a chevron layout is minimized (e.g., to less than 100 nm), the above-described implant sequences are no longer effective. That is, as illustrated in FIG. 4, at the twist angles 310*b* and 310*c* (i.e., 150° and 210°), the mask 301 used to protect the first semiconductor fins 100 creates a shadow 425 over one or more of the second semiconductor fins 110 and blocks dopant implantation. The size of the shadow 425 and its location relative to the second semiconductor fins 110 will vary depending upon the height of the mask 301, the length of the mask 301, the tilt angle 315, the height of the second semiconductor fins 110, their distance from the mask 301, etc. Thus, there is a need in the art for an improved method of forming p-type and n-type MUGFETs with high mobility crystalline planes in high-density, chevron-patterned, CMOS devices.

In view of the foregoing, disclosed herein are embodiments of an improved method of forming p-type and n-type MUGFETs with high mobility crystalline planes in high-density, chevron-patterned, CMOS devices. Specifically, semiconductor fins are formed in a chevron layout oriented along a centerline of a wafer. Gates are formed adjacent to the semiconductor fins such that they are approximately perpendicular to the centerline. Then, masked implant sequences are performed, during which halo and/or source/drain dopants are implanted into the sidewalls of the semiconductor fins on one side of the chevron layout and then into the sidewalls of the semiconductor fins on the opposite side of the chevron layout. The implant direction used during these implant sequences is substantially orthogonal to the gates in order to avoid mask shadowing, which can obstruct dopant implantation when separation between the semiconductor fins in the chevron layout is scaled (i.e., when device density is increased).

Figure 5:
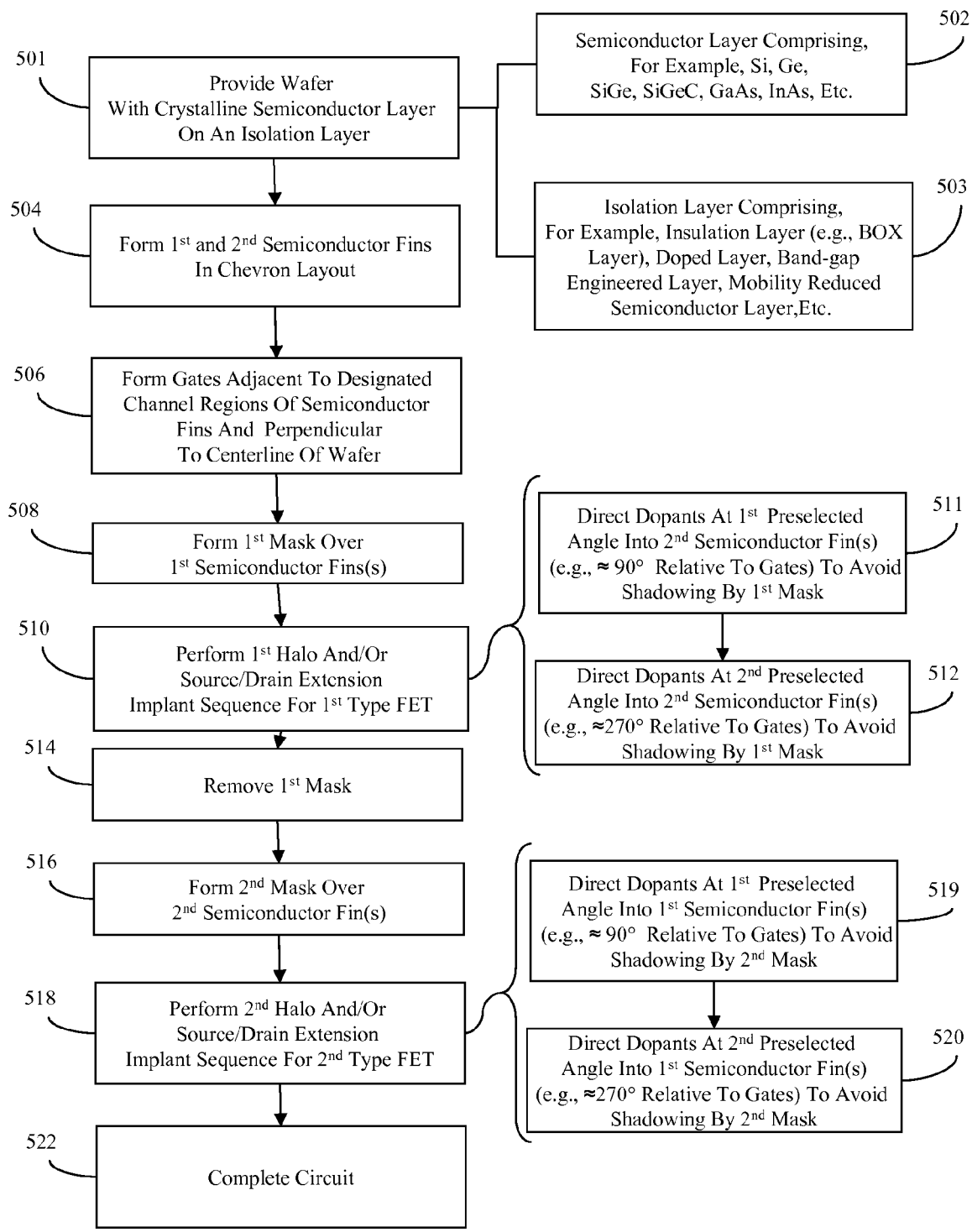
FIG. 5 is a flow diagram illustrating an embodiment of a method of the invention.

More particularly, referring to FIG. 5, disclosed herein are embodiments of an improved method of forming a CMOS device with at least one n-type MUGFET and at least one p-type MUGFET in a chevron layout to provide optimal charge carrier mobility. The method embodiments comprise providing a wafer having a single crystalline semiconductor layer on an isolation layer (501). For example, the semiconductor layer of the wafer can comprise a layer of silicon (Si), germanium (Ge), silicon germanium (SiGe), silicon germanium carbide (SiGeC), gallium arsenide (GaAs) or indium arsenide (InAs) or any other suitable crystalline semiconductor layer (502). The isolation layer of the wafer can, for example, comprise an insulator layer (e.g., a buried oxide layer, such as a silicon dioxide ($SiO_2$)) layer), a doped layer, a band-gap engineered layer, mobility reduced semiconductor layer, etc. (503). At least one first semiconductor body 100 and at least one second semiconductor body 110 are formed on the wafer 1 such that each first semiconductor body 100 is non-parallel and non-orthogonal relative to each second semiconductor body 110 (504, as illustrated in FIGS. 1 and 2).

Specifically, the first and second semiconductor bodies 100, 110 can be formed from the crystalline semiconductor layer, using known techniques, such as lithographic patterning or sidewall image transfer techniques. Using these known techniques, the first and second semiconductor bodies 100, 110 can be formed as semiconductor fins (i.e., rectangular shaped planes) configured for a desired type of MUGFET. Specifically, for finFETs the height to width ratio of the semiconductor fins 100, 110 can be approximately 4:1, whereas for trigate FETs it can range between 3:2 and 2:3. The spacing 162 between adjacent semiconductor bodies can, for example, be less than approximately 60 nm. Additionally, the first and second semiconductor bodies 100, 110 can be formed at predetermined angles 131, 132 relative to a centerline 160 of the wafer 1 such that the first semiconductor body 100 has a first crystalline orientation and the second semiconductor body 110 has a second crystalline orientation that is different from the first crystalline orientation. For example, the first and second semiconductor bodies 100, 110 can each be formed at approximately 22.5° angles 131, 132 relative to a centerline 160 of the wafer 1 such that each first semiconductor body 100 is positioned at an approximately 45° angle relative to each second semiconductor body 110. In this case, if the crystalline semiconductor layer has a [100] crystalline orientation, then each first semiconductor body 100 will have a [100] crystalline orientation, which exhibits high electron mobility for optimal NFET performance, and each second semiconductor body 110 will have a [110] crystalline orientation, which exhibits high hole mobility for optimal PFET performance.

Next, gates 150 can be formed adjacent to the first and second semiconductor bodies 100, 110 such that the gates are approximately perpendicular to the centerline 160 of the wafer 1 (506, see FIGS. 1 and 2). Specifically, a gate dielectric layer can be formed over the fins 100, 110. This gate dielectric layer can comprise, for example, an oxide (e.g., $SiO_2$), a nitride (e.g., SiN), an oxynitride, a high-k dielectric material or any other suitable gate dielectric material. Then, a gate conductor layer (e.g., a polysilicon layer) can be formed over the gate dielectric layer so as to form a gate stack. The gate stack can then be lithographically patterned and etched to form gates 150 that are positioned orthogonally relative to the wafer centerline 160 and that are further positioned on the opposing sidewalls and, in the case of trigate FETs, on the top surface of semiconductor fins 100, 110 adjacent to designated channel regions. Thus, if the first and second semiconductor bodies 100, 110 are angled at 22.5° relative to the centerline 160 of the wafer 1, then the gates 150 will be positioned at an approximately 67.5° angle with respect to each first semiconductor fin 100 and at an approximately 112.5° angle with respect to each second semiconductor fin 110. Gate sidewall spacers can, as necessary, be formed adjacent to the semiconductor fins 100, 110 on either side of the gates 150 (not shown).

After the gates 150 are formed, a first mask 301 can be formed covering each first semiconductor body 100 (508). Next, a first implant sequence can be performed so as to implant dopants into the opposing sidewalls 111, 112 of each second semiconductor body 110 in order to form halo and/or source/drain extension regions of first type FETs. In the case of [110] orientation semiconductor fins, which provide for optimal hole mobility, the dopants can comprise halo dopants and/or source/drain extension dopants suitable for PFETs. For PFETs, the halo dopants can comprise n-type dopants (e.g., phosphorous (P), antimony (Sb) or arsenic (As)) and the source/drain extensions dopants can comprise p-type dopants (e.g., boron (B)).

Figure 6:
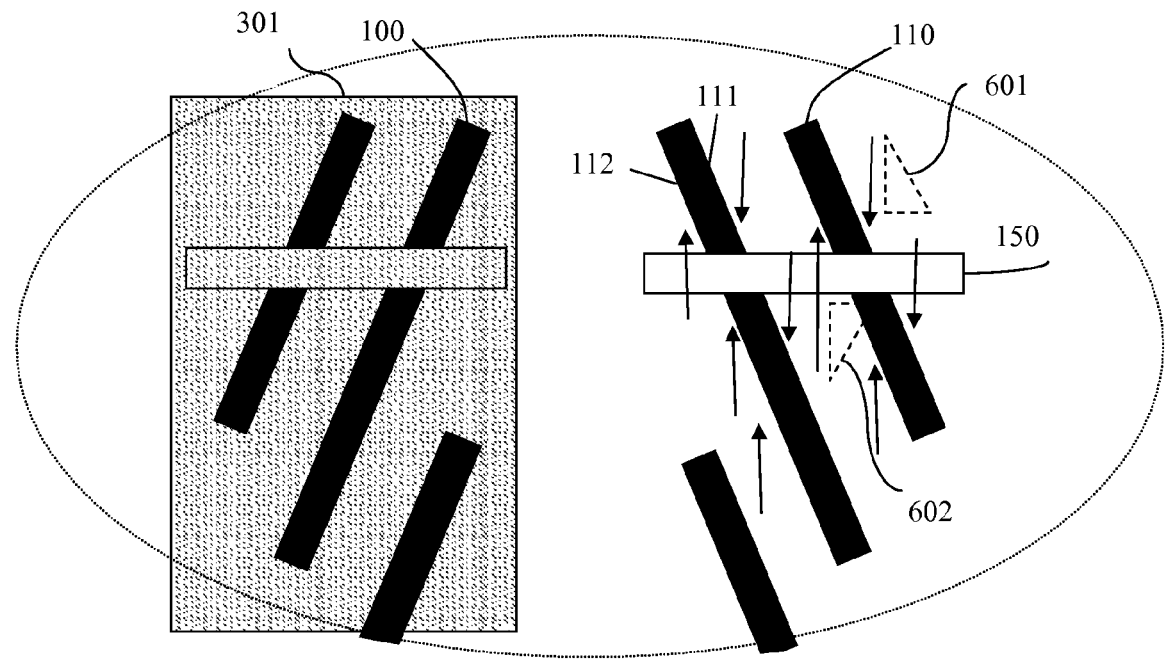
FIG. 6 is a cross-section view diagram illustrating the first implant sequence in the method of FIG. 5.

As illustrated in FIG. 6, this first implant sequence can comprise directing dopants into the first sidewall 111 of each second semiconductor body 100 at a first twist angle 601 relative to the gates 150 (511) and, then directing the dopants into the second sidewall 112 of each second semiconductor body 110 at a second twist angle 602 relative to the gates 150 (512). The first and second twist angles 601, 602 can be pre-selected to ensure that implantation of the dopants into the opposing sidewalls 111, 112 of the second semiconductor body 110 is not obstructed by the first mask 301. For example, the first twist angle 601 can be an approximately 90° angle relative to the gates 150 and the second twist angle 602 can be an approximately 270° angle relative to the gates 150. Implanting the dopants into the sidewalls 111, 112 of the second semiconductor body 110 from a direction that is substantially orthogonal to the gates 150 prevents shadowing by the first mask 301 over any second semiconductor body 110. It should be noted that the tilt angle during the first implant sequence should be approximately 15-30° relative to the top surface of the wafer 1 so as to ensure that dopant implantation into one second semiconductor fin 110 is not obstructed by an adjacent second semiconductor fin 110.

The process is repeated for each first semiconductor body. Specifically, the first mask 301 is removed from each first semiconductor body 100 (514) and a second mask 302 is formed covering each second semiconductor body 110 (516). Next, a second implant sequence is performed so as to implant additional dopants into the opposing sidewalls 101, 102 of each first semiconductor body 100 in order to form halo and/or source/drain extension regions of second type FETs (518). In the case of [100] orientation semiconductor fins, which provide for optimal electron mobility, the additional dopants can comprise halo dopants and/or source/drain extension dopants suitable for NFETs. For NFETs, the halo dopants can comprise p-type dopants (e.g., boron (B)) and the source/drain extensions dopants can comprise n-type dopants (e.g., phosphorous (P), antimony (Sb) or arsenic (As)).

Figure 7:
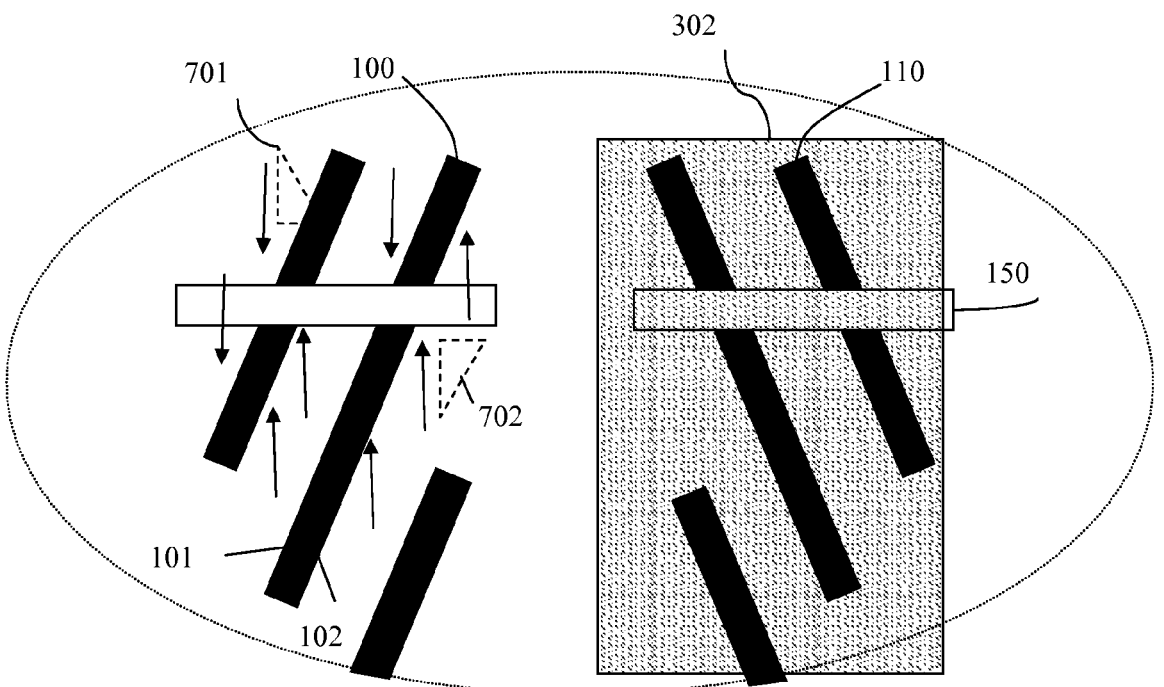
FIG. 7 is a cross-section view diagram illustrating the second implant sequence in the method of FIG. 5.

As with the first implant sequence and as illustrated in FIG. 7, the second implant sequence comprises directing the additional dopants into the first sidewall 101 of each first semiconductor body 100 at a first twist angle 701 relative to the gates 150 (519) and, then, directing the additional dopants into the second sidewall 102 of each first semiconductor body 100 at a second twist angle 702 relative to the gates 150. The implant twist angles 701-702 can be the same for the second implant sequence as they are for the first implant sequence. That is, the first twist angle 701 and the second twist angle 702 of the second implant sequence can be pre-selected to ensure that implantation of the additional dopants into the opposing sidewalls 101, 102 of each first semiconductor body 100 is not obstructed by the second mask 302. For example, the first twist angle 701 can be an approximately 90° angle relative to the gates 150 and the second twist angle 702 can be an approximately 270° angle relative to the gates 150. Implanting the additional dopants into the sidewalls 101, 102 of each first semiconductor body 100 from a direction that is substantially orthogonal to the gates 150 prevents shadowing by the second mask 302 over any first semiconductor body 100. It should be noted that the tilt angle during the second implant sequence should also be approximately 15-30° relative to the top surface of the wafer 1 so as to ensure that dopant implantation into one first semiconductor fin 100 is not obstructed by an adjacent first semiconductor fin 100.

Following the above-describe implant sequences (508) and (516), additional processing (e.g., epitxial semiconductor growth, silicide formation, gate sidewall spacer formation, interlevel dielectric formation, contact formation, interconnect and wiring formation, etc.) can be performed in order to complete the circuit structure 10 (522).

Therefore, disclosed above are embodiments of an improved method of forming p-type and n-type MUGFETs with high mobility crystalline planes in high-density, chevron-patterned, CMOS devices. Specifically, semiconductor fins are formed in a chevron layout oriented along the centerline of a wafer. Gates are formed adjacent to the semiconductor fins such that they are approximately perpendicular to the centerline. Then, masked implant sequences are performed, during which halo and/or source/drain dopants are implanted into the sidewalls of the semiconductor fins on one side of the chevron layout and then into the sidewalls of the semiconductor fins on the opposite side of the chevron layout. The implant direction used during these implant sequences is substantially orthogonal to the gates in order to avoid mask shadowing, which can obstruct dopant implantation when separation between the semiconductor fins in the chevron layout is scaled. The method embodiments further have the advantage of reducing the number of process steps required for each implant sequence. Additionally, increased density of circuits results from this invention. This in turn results in reduced manufacturing cost, reduced power consumption, and increase circuit speed.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the embodiments can be practiced with modification within the spirit and scope of the appended claims.

What is claimed is:

1. A method of forming a semiconductor device, said method comprising:
    providing a wafer comprising a semiconductor layer on an isolation layer;
    etching said semiconductor layer to form, on said isolation layer, a first semiconductor fin, having a first center region between first end regions, for a first device with a first conductivity type and a second semiconductor fin, having a second center region between second end regions, for a second device with a second conductivity type different from said first conductivity type such that said first semiconductor fin and said second semiconductor fin each comprise a rectangular-shaped body extending vertically from said isolation layer, and such that a chevron pattern is created with said first semiconductor fin non-parallel and non-orthogonal relative to said second semiconductor fin;
    forming a first gate adjacent to first opposing sidewalls of said first semiconductor fin on said first center region and a second gate adjacent to second opposing sidewalls of said second semiconductor fin on said second center region such that said first gate and said second gate are approximately perpendicular to a centerline of said wafer;
    forming a mask covering said first semiconductor fin and having an edge approximately parallel to said centerline of said wafer; and
    performing a series of only two implant processes directed into said second opposing sidewalls of said second semiconductor fin to form one of halo regions and source/drain regions in said second end regions of said second semiconductor fin on opposite sides of said second gate, wherein said series of only two implant processes comprises:
        directing dopant in a first direction towards one of said second opposing sidewalls of said second semiconductor fin so as to simultaneously implant said dopants through said one of said second opposing sidewalls into each of said second end regions, said first direction being non-parallel relative to said second semiconductor fin; and
        directing said dopant in a second direction opposite said first direction towards a different one of said second opposing sidewalls of said second semiconductor fin so as to simultaneously implant said dopant through said different one of said second opposing sidewalls into each of said second end regions wherein first direction and said second direction are parallel to said edge to ensure that implantation of said dopants into said second semiconductor fin is not obstructed by said mask.

2. The method according to claim 1, wherein said dopants comprise one of halo dopants and source/drain dopants for a first type field effect transistor.

3. The method according to claim 1, further comprising:
    removing said mask from said first semiconductor fin;
    forming a second mask covering said second semiconductor fin; and
    performing a second series of only two implant processes directed into said first opposing sidewalls of said first semiconductor fin so as to form one of additional halo regions and additional source/drain region in said first end regions of said first semiconductor fin on opposite sides of said first gate, wherein said second series of implant processes comprises:
        directing additional dopants in said first direction towards one of said first opposing sidewalls of said first semiconductor fin so as to simultaneously implant said additional dopants through said one of said first opposing sidewalls into each of said first end regions; and
        directing said additional dopants in said second direction towards a different one of said first opposing sidewalls of said first semiconductor fin so as to simultaneously implant said additional dopants through said different one of said first opposing sidewalls into each of said first end regions.

4. The method according to claim 3, wherein said additional dopants comprise one of halo dopants and source/drain dopants for a second type field effect transistor.

5. The method according to claim 1,
    wherein said semiconductor layer comprises a crystalline semiconductor layer, and wherein said forming of said first semiconductor fin and said second semiconductor fin further comprises forming said first semiconductor fin and said second semiconductor fin from said crystalline semiconductor layer and at predetermined angles relative to said centerline such that said first semiconductor fin has a first crystalline orientation and said second semiconductor fin has a second crystalline orientation different from said first crystalline orientation.

6. The method according to claim 1,
    wherein said semiconductor layer comprises a crystalline semiconductor layer, and
    wherein said forming of said first semiconductor fin and said second semiconductor fin further comprises forming said first semiconductor fin and said second semiconductor fin from said crystalline semiconductor layer and at approximately 22.5° angles relative to said centerline such that said first semiconductor fin is positioned at an approximately 45° angle relative to said second semiconductor fin.

7. The method according to claim 6, wherein said crystalline semiconductor layer has a [100] crystalline orientation, said first semiconductor fin has a [100] crystalline orientation and said second semiconductor fin has a crystalline orientation.

8. The method according to claim 1, wherein said semiconductor layer comprises one of silicon, germanium, silicon germanium, silicon germanium carbide, gallium arsenide, and indium arsenide.

9. A method of forming a semiconductor device, said method comprising:

providing a wafer comprising a semiconductor layer on an isolation layer;

etching said semiconductor layer to form, on said isolation layer, a first semiconductor fin, having a first center region between first end regions, for a first device having a first conductivity type and a second semiconductor fin, having a second center region between second end regions, for a second device having a second conductivity type different from said first conductivity type such that said first semiconductor fin and said second semiconductor fin each comprise a rectangular-shaped body extending vertically from said isolation layer, and such that a chevron pattern is created with said first semiconductor fin non-parallel and non-orthogonal relative to said second semiconductor fin;

forming a first gate adjacent to first opposing sidewalls of said first semiconductor fin on said first center region and a second gate adjacent to second opposing sidewalls of said second semiconductor fin on said second center region such that said first gate and said second gate are approximately perpendicular to a centerline of said wafer;

forming a mask covering said first semiconductor fin and having an edge approximately parallel to said centerline of said wafer; and performing a series of only two implant processes directed into said second opposing sidewalls of said second semiconductor fin to form one of halo regions and source/drain regions in said second end regions of said second semiconductor fin on opposite sides of said second gate, wherein said series of only two implant processes comprises:

directing dopants in a first direction towards one of said second opposing sidewalls of said second semiconductor fin so as to simultaneously implant said dopants through said one of said second opposing sidewalls into each of said second end regions, said first direction being at an approximately 157.5° angle relative to said one of said second opposing sides of said second semiconductor fin; and directing said dopants in a second direction opposite said first direction towards a different one of said second opposing sidewalls of said second semiconductor fin so as to simultaneously implant said dopants through said different one of said second opposing sidewalls into each of said second end regions wherein said first direction and said second direction are parallel to said edge to ensure that implantation of said dopants into said second semiconductor fin is not obstructed by said mask.

10. The method according to claim 9, wherein said dopants comprise one of halo dopants and source/drain dopants for a first type field effect transistor.

11. The method according to claim 9, further comprising:
removing said mask from said first semiconductor fin;
forming a second mask covering said second semiconductor fin; and
performing a second series of only two implant processes directed into said first opposing sidewalls of said first semiconductor fin so as to form one of additional halo regions and additional source/drain region in said first end regions of said first semiconductor fin on opposite sides of said first gate, wherein said second series of implant processes comprises:

directing additional dopants in said first direction towards one of said first opposing sidewalls of said first semiconductor fin so as to simultaneously implant said additional dopants through said one of said first opposing sidewalls into each of said first end regions; and directing said additional dopants in said second direction towards a different one of said first opposing sidewalls of said first semiconductor fin so as to simultaneously implant said additional dopants through said different one of said first opposing sidewalls into each of said first end regions.

12. The method according to claim 11, wherein said additional dopants comprise one of halo dopants and source/drain dopants for a second type field effect transistor.

13. The method according to claim 9,
wherein said semiconductor layer comprises a crystalline semiconductor layer, and
wherein said forming of said first semiconductor fin and said second semiconductor fin further comprises forming said first semiconductor fin and said second semiconductor fin from said crystalline semiconductor layer and at predetermined angles relative to said centerline such that said first semiconductor fin has a first crystalline orientation and said second semiconductor fin has a second crystalline orientation different from said first crystalline orientation.

14. The method according to claim 9,
wherein said semiconductor layer comprises a crystalline semiconductor layer, and
wherein said forming of said first semiconductor fin and said second semiconductor fin further comprises forming said first semiconductor fin and said second semiconductor fin from said crystalline semiconductor layer and at approximately 22.5° angles relative to said centerline such that said first semiconductor fin is positioned at an approximately 45° angle relative to said second semiconductor fin.

15. The method according to claim 14, wherein said crystalline semiconductor layer has a [100] crystalline orientation, said first semiconductor fin has a [100] crystalline orientation and said second semiconductor fin has a [110] crystalline orientation.

16. The method according to claim 9, wherein said semiconductor layer comprises one of silicon, germanium, silicon germanium, silicon germanium carbide, gallium arsenide, and indium arsenide.

17. A method of forming a semiconductor device, said method comprising:

providing a wafer comprising a semiconductor layer on an isolation layer;

etching said semiconductor layer to form, on said isolation layer, a first semiconductor fin, having a first center region between first end regions, for a first device with a first conductivity type and a second semiconductor fin, having a second center region between second end regions, for a second device with a second conductivity type different from said first conductivity type such that said first semiconductor fin and said second semiconductor fin each comprise a rectangular-shaped body extending vertically from said isolation layer, and such that a chevron pattern is created with said first semiconductor fin non-parallel and non-orthogonal relative to said second semiconductor fin;

forming a first gate adjacent to first opposing sidewalls of said first semiconductor fin on said first center region and a second gate adjacent to second opposing sidewalls of said second semiconductor fin on said second center region such that said first gate and said second gate are approximately perpendicular to a centerline of said wafer;

forming a first mask covering said first semiconductor and having a first edge approximately parallel to said centerline of said wafer;

performing a first series of only two implant processes directed into said second opposing sidewalls of said second semiconductor fin to form one of halo regions and source/drain regions in said second end regions of said second semiconductor fin on opposite sides of said second gate, wherein said first series of only two implant processes comprises:

directing dopant in a first direction towards one of said second opposing sidewalls of said second semiconductor fin so as to simultaneously implant said dopants through said one of said second opposing sidewalls into each of said second end regions, said first direction being at an approximately 157.5° angle relative to said one of said second opposing sides of said second semiconductor fin; and directing said dopants in a second direction opposite said first direction towards a different one of said second opposing sidewalls of said second semiconductor fin so as to simultaneously implant said dopants through said different one of said second opposing sidewalls into each of said second end regions, removing said first mask from said first semiconductor fin;

forming a second mask covering said second semiconductor fin and having a second edge approximately parallel to said centerline of said wafer; and performing a second series of only two implant processes directed into said first opposing sidewalls of said first semiconductor fin so as to form one of additional halo regions and additional source/drain region in said first end regions of said first semiconductor fin on opposite sides of said first gate, wherein said second series of implant processes comprises:

directing additional dopants in said first direction towards one of said fist opposing sidewalls of said first semiconductor fin so as to simultaneously implant said additional dopants through said one of said first opposing sidewalls into each of said first end regions; and directing said additional dopants in said second direction towards a different one of said first opposing sidewalls of said first semiconductor fin so as to simultaneously implant said additional dopants through said different one of said first opposing sidewalls into each of said first end regions wherein said first direction and said second direction are parallel to said first edge to ensure that implantation of said dopants into said second semiconductor fin is not obstructed by said first mask, and wherein said first direction and said second direction are further parallel to said second edge to ensure that implantation of said additional dopants into said first semiconductor fin is not obstructed by said second mask.

18. The method according to claim 17, wherein said dopants comprise one of halo dopants and source/drain dopants for a first type field effect transistor and wherein said additional dopants comprise one of halo dopants and source/drain dopants for a second type field effect transistor.

19. The method according to claim 17, wherein said semiconductor layer comprises a crystalline semiconductor layer, and wherein said forming of said first semiconductor fin and said second semiconductor fin further comprises forming said first semiconductor fin and said second semiconductor fin from said crystalline semiconductor layer and at predetermined angles relative to said centerline such that said first semiconductor fin has a first crystalline orientation and said second semiconductor fin has a second crystalline orientation different from said first crystalline orientation.

20. The method according to claim 17, wherein said semiconductor layer comprises a crystalline semiconductor layer, and wherein said forming of said first semiconductor fin and said second semiconductor fin further comprises forming said first semiconductor fin and said second semiconductor fin from said crystalline semiconductor layer and at approximately 22.5° angles relative to said centerline such that said first semiconductor fin is positioned at an approximately 45° angle relative to said second semiconductor fin.

* * * * *